United States Patent [19]
> Solow

[11] 4,176,445
[45] Dec. 4, 1979

[54] METAL FOIL RESISTOR
[75] Inventor: Benjamin Solow, North Hollywood, Calif.
[73] Assignee: Angstrohm Precision, Inc., Hagerstown, Md.
[21] Appl. No.: 803,291
[22] Filed: Jun. 3, 1977
[51] Int. Cl.² .............................................. H01C 7/00
[52] U.S. Cl. ........................................ 29/620; 29/621; 29/627; 338/195; 338/275
[58] Field of Search ................. 29/620, 611, 627, 628, 29/630 R, 621; 338/275, 195, 308

[56] References Cited
U.S. PATENT DOCUMENTS

| | | | |
|---|---|---|---|
| 3,109,228 | 11/1963 | Dyke | 29/620 |
| 3,350,777 | 11/1967 | Mendelsohn | 29/620 |
| 3,517,436 | 6/1970 | Zandman | 29/620 |
| 3,757,745 | 9/1973 | Wilker | 29/620 |
| 3,778,744 | 12/1973 | Brandi | 338/275 |
| 3,824,521 | 7/1974 | Horii | 338/275 |
| 3,842,495 | 10/1974 | Bennett | 29/620 |
| 4,053,977 | 10/1977 | Simon | 29/620 |
| 4,075,452 | 2/1978 | Simon | 29/620 |

*Primary Examiner*—Francis S. Husar
*Assistant Examiner*—Gene P. Crosby
*Attorney, Agent, or Firm*—Fisher, Christen & Sabol

[57] ABSTRACT

A thin film foil resistor is disclosed wherein a thin metallic foil is bonded to an insulating substrate and a circuit path is formed on the foil by photographic artwork-etching techniques. After the circuit is formed, the structure is subjected to another etching process to reduce the thickness of the foil circuit thereby adjusting the value of the resistor. Terminal lands of the circuit are electroplated and the connecting leads are soldered to the lands. The value of the resistor is finally adjusted by use of a laser beam, and the resistor is encapsulated.

19 Claims, 8 Drawing Figures

METAL FOIL RESISTOR

FIELD OF INVENTION

This invention relates to metal foil resistors, more specifically, a method of making such resistors.

DESCRIPTION OF THE PRIOR ART

Metal foil resistors, per se, as well as methods of making such resistors are well known in the art. Generally speaking, these resistors comprise an insulating substrate (usually of glass or ceramic material); a thin metallic foil bonded to the substrate, the foil having a circuit path thereon usually formed by photographic-acid etch techniques; connector leads attached to the thin foil at each end of the circuit path; and a protective coating surrounding the entire structure.

Typically the photographic-acid etch technique of forming the circuit path comprises the steps of photographing the desired circuit path and reducing the artwork in size to correspond to the desired size of the final resistor; coating the thin metal foil with a photosensitive masking medium; exposing the coated side of the foil to the photographed circuit; and, subjecting the exposed foil to an etching process wherein all foil not corresponding to the desired circuit is removed. The etching process may be undertaken either before or after the foil has been bonded to the substrate.

Resistors formed by methods analogous to the afore-described processes are exhibited by the following U.S. Pat. Nos.:

2,899,658, Bean, Aug. 11, 1959;
3,071,749, Starn, Jan. 1, 1963;
3,405,381, Zandman, et al., Oct. 8, 1968;
3,517,436, Zandman, et al., June 30, 1970.

Despite the general acceptance of this basic method by the electronics industry, the resistors formed thereby have exhibited several deficiencies. Among the more prominent problems has been the use of a welding process to attach the connector leads to the terminals of the foil circuit path. Due to the small size of the terminals and the thinness of the circuit foil (on the order of 0.0001") the welds attaching the relatively thick connector leads to the circuit terminals have exhibited very poor strength. Normal usage often causes a breakage in the welds and, consequently, a catastrophic failure in the resistor due to the open circuit.

A typical foil circuit has a serpentine current path defined by a series of closely spaced foil "legs." The value of the resistance may be adjusted, to overcome inaccuracies inherent in the manufacturing process, by cutting through specifically designated portions of the circuit to alter the path of current travel. This method of adjustment requires a number of circuit portions for fine adjustment, since the adjustment must be made in discrete steps.

In the prior art resistors, the required adjustment causes serious deficiencies, notably the extremely fine lines used to adjust circuit patterns by the scratch and break method are often much finer than the basic pattern and are, therefore, sensitive to the tiniest defects during manufacture. Obviously, this decreases the reliability of the resistor.

Also, in the prior art methods of adjusting by cutting through the foil to alter the current path, it is necessary to carry out the adjustment manually, usually by an operator with the aid of a microscope. The manual adjustment necessitates a large amount of time in the production process and results in a higher priced product which is subject to human error.

Many prior art resistors devote a portion of the foil area to a trimmer circuit pattern, i.e., a pattern used solely in the adjusting operation to adjust the value of the resistor. This portion serves no other purpose than adjustment, and results in a resistor somewhat larger in size than is absolutely necessary.

The standard adjustment technique of cutting the foil to the current flow path also contributes to unnecessary size since, usually, a number of conductor lines do not carry any current. In this age of miniaturization, it is a serious product deficiency to have unused or partially used space which results in a resistor larger than necessary.

SUMMARY OF THE INVENTION

The present invention relates to thin metal foil resistors. The method comprises the steps of bonding an annealed thin metallic foil to an insulating substrate using an epoxy glue; coating the foil surface of the laminate with a photosensitive masking medium; exposing the coated surface to photographic artwork of the desired circuit pattern or patterns; etching away the metallic foil not required for the circuit; removing the masking medium; etching the thickness of the circuit pattern to roughly adjust the value of the resistor; re-coating the circuit with a masking medium except for the terminal lands to which the connecting leads are to be attached; electroplating the terminal lands; removing the masking medium; soldering the connecting leads to the terminal lands; coating the resistor with varnish; laser adjusting the resistor to its final value; coating the resistor with rubber for strain relief; and encapsulating the completed resistor structure.

By etching the thickness of the circuit pattern to achieve the rough adjustment of the resistance value, the present invention does not require a resistor to have a separate portion of the circuit used only for value adjustment. Thus, a resistor formed by this method allows the maximum amount of the substrate area to be utilized for the actual resistor circuit. This allows a given value resistor to be smaller in size or, conversely, a larger circuit path to be incorporated onto a given substrate area.

The coarse adjust may be carried out by automated methods, thereby eliminating the manual adjust required by prior art techniques.

The present invention also eliminates the problem of the poor strength welds attaching the connecting leads to the terminal lands by plating the lands and soldering the connecting leads thereto. The strength of the connection is improved since the solder holds over the entire area of the terminal lands, not just in one spot like the welds.

DETAILED DESCRIPTION OF PREFERRED EMBODIMENT

Figure 1:
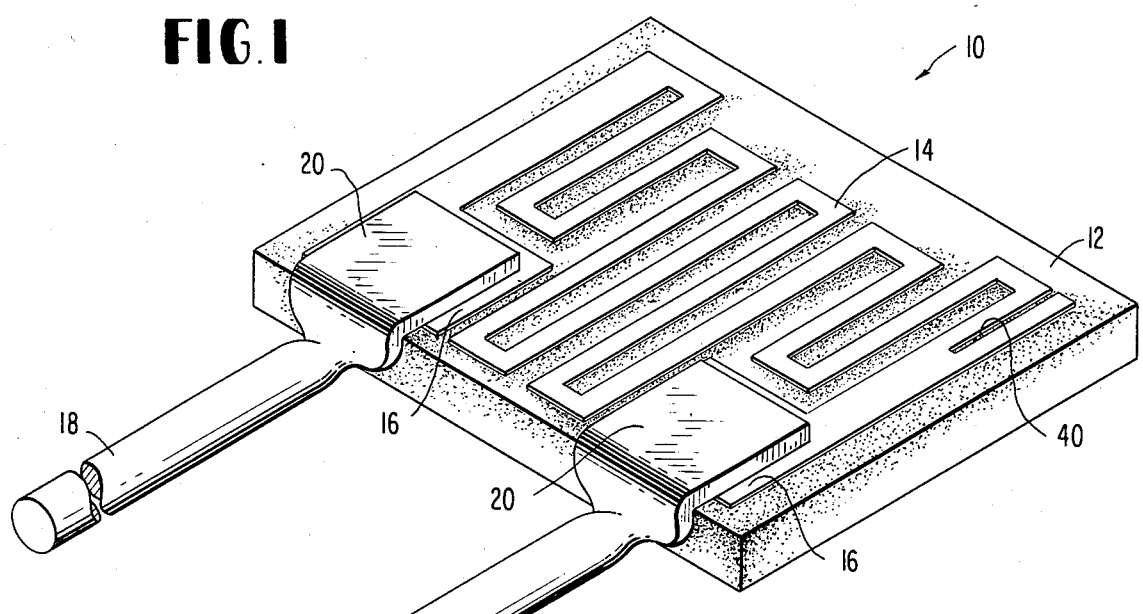
FIG. 1 is a perspective view of a resistor made according to the invention, with the coatings and encapsulation omitted for clarity.
Figure 2:
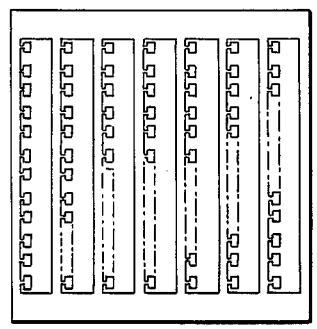
FIG. 2 is a top view of a substrate having a plurality of resistor circuits thereon according to the invention.

A resistor made by the preferred embodiment of this invention is illustrated in FIG. 1 generally as 10 and comprises a substrate 12 of insulative material, such as glass or ceramic, a thin metallic foil resistor circuit pattern 14 with integral terminal lands 16, and connecting leads 18 having flattened portions 20 attached to the terminal lands 16 by soldering. The resistor as just described may be encapsulated by molding an insulating material around the entire structure after first coating with varnish (such as Dow Corning G P 77 NP) and rubber or by potting in a case, as is well known in the art. The encapsulation and coatings are omitted from FIG. 1 for purposes of clarity. The individual resistor 10 is cut from a series of resistor patterns 14 applied to a substrate as shown in FIG. 2. These resistor patterns are formed by a thin metallic foil which has been bonded to the substrate by a laminating process to be described hereinafter, and subsequently subjected to a photographic artwork-etching process which removes all of the foil except that which forms the circuit patterns.

Prior to bonding to the substrate, the thin metallic foil is first annealed. The metal foil may be made from any resistive alloy, such as Evanohm alloy made by Wilbur B. Driver Co. and is on the order of 0.0001" thick. The foil is annealed by heating it in an inert atmosphere at 1000° F. for a sufficient time to provide a temperature coefficient of resistance of the completed resistor in combination with the particular substrate of approximately zero. The requisite time will, of course, vary with the particular alloy metal film being used, but for Evanohm metal foil, it has been found that heating the foil at 1000° F. for a period of approximately 15 minutes will produce the desired temperature coefficient of resistance when laminated to a Soda Lime glass substrate.

A thin layer of epoxy glue, on the order of 0.0002" thick, is applied to one surface of the substrate. A thin, even layer may be applied by spinning the substrate about a central axis perpendicular to the plane of the substrate and applying a small drop of epoxy to the center of rotation. The centrifugal force generated by the spinning will spread the epoxy evenly over the substrate surface. Of course, any other method of applying the epoxy, which results in a thin, even layer, may also be used.

Figure 3:
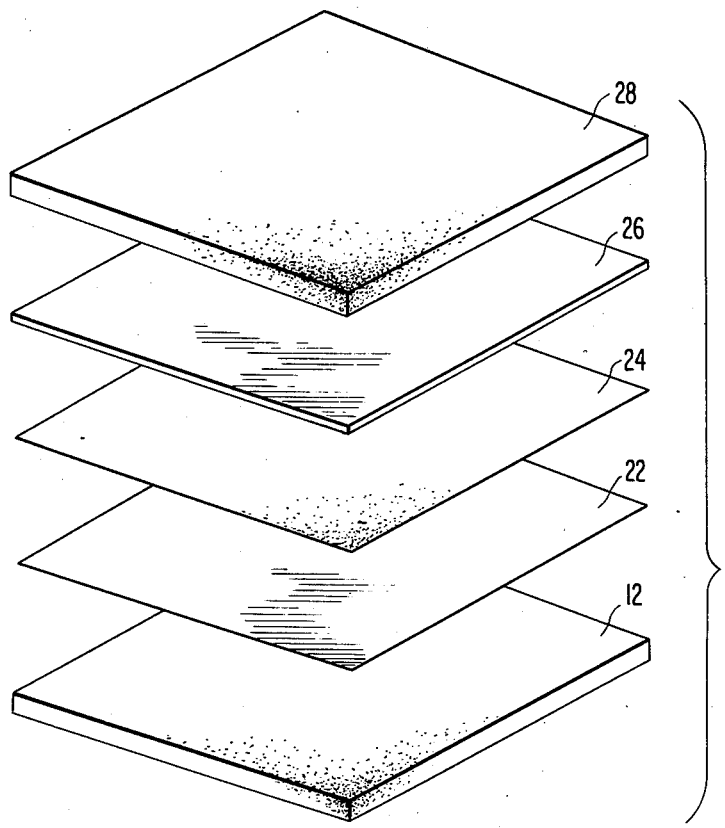
FIG. 3 is an exploded perspective view showing the laminating process of the invention.

After the epoxy has been applied to the surface, the annealed thin metal foil is laminated to the substrate. The lamination is accomplished by placing the thin metal foil 22 in contact with the epoxy coated substrate surface 12 and placing on top of the foil, as shown in FIG. 3, a sheet of Mylar 24, a layer of thin stainless steel 26, and, finally, a layer of rubber sheet 28. The rubber sheet may be silicone rubber approximately 1/16" thick. This entire assembly is placed in a vacuum press. The press is first closed to form a vacuum seal, without exerting any pressure on the laminate, and a vacuum of approximately 1 mm of Hg is maintained for 1 minute. The press is then closed fully to exert a pressure of approximately 1000 psi and the laminate is cured for 20 minutes at 335° F. in the press. The assembly is then removed from the press and further cured for 40 minutes at 350° F. in an oven. After the curing cycle is completed, the laminate is removed from the oven and the rubber, stainless steel, and Mylar sheets are removed, leaving the thin metal foil bonded to the substrate. Since the Mylar does not stick to the epoxy, no mold release is required. The stainless steel sheet 26 prevents the stretching of Mylar sheet 24 during compression, thereby preventing damage to metal foil 22.

The circuit pattern is formed on the foil by standart photographic artwork-etching techniques. As a practical matter, several patterns are formed on each substrate, as shown in FIG. 2. It is not necessary to specifically delineate the details of this process, as it is well known to those having reasonable skill in the art. Briefly, the desired circuit pattern or a plurality of such patterns are photographed and reduced to the desired size. The foil is coated with a photosensitive masking medium, such as Kodak KTFR, and exposed to the photographic circuit pattern. The KTFR is retained on the foil only on the desired circuit pattern. The foil and substrate are then subjected to an acid etching bath which removes all foil except that covered by the KTFR. The KTFR is removed, leaving only the thin metallic foil in the desired circuit pattern on the substrate. Although Kodak KTFR has been mentioned in the above description, any other suitable photo-resist material may also be used such as Hunt Sc, or Shipley AZIII or AZ 1350J. The acid bath may consist of hydrochloric acid, nitric acid and water or hydrochloric acid and stannous chloride.

All of the aforementioned operations have been carried out while the resistors are on a common substrate such as shown in FIG. 2. At this point, the individual resistors are separated by diamond saw cutting or other standard, known technique such as scribing and breaking.

The next step in the method of the instant invention is to coarse adjust the resistor to its approximate value by subjecting it to another acid etching process to reduce the thickness of the foil pattern. This etching will adjust the resistor to ±1% or better of its final value. The etchant used to adjust the thickness may be the same used to form the pattern, but further diluted with water.

The etching adjustment process comprises the steps of spraying an etching solution onto the metal foil or placing the resistor in an etching tank for a predetermined period of time; removing the resistor from the etching tank and placing into a rinse solution to rinse off the etchant; drying the resistor; and measuring its value. Prior to etching the thickness, the terminal lands may be coated with a photo-resist material to prevent the etching adjust process from reducing their thickness.

Figure 6:
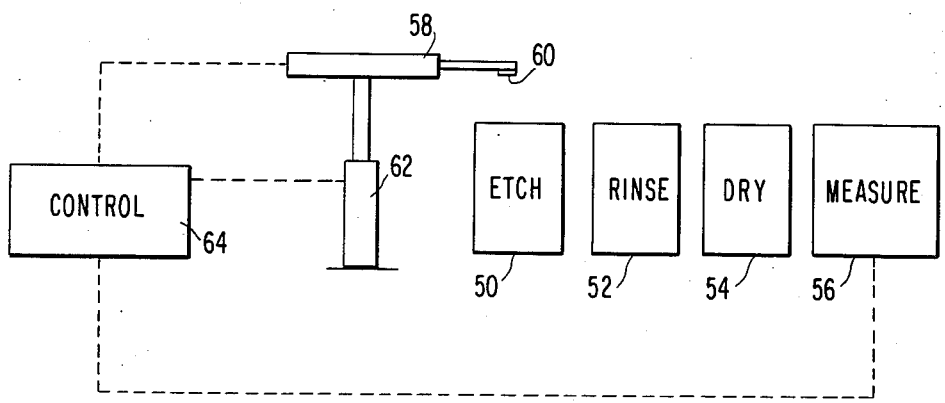
FIG. 6 is a diagrammatic representation of the process for etching the thickness of the resistor according to the invention.

The aforementioned etching adjust process may be carried out by manually transferring the resistor from etching through measuring, but is ideally carried out by apparatus which automatically moves the resistor through the sequence of adjusting steps. One form of apparatus is shown diagrammatically in FIG. 6 wherein tanks or troughs 50 and 52 contain the etching solution and rinsing water, and the drying and measuring apparatus are indicated at 54 and 56. Extendable or slidable arm 58 has means 60 mounted thereon to grip a resistor, and is mounted on vertically extensible and retractable base 62. In use, the resistor is manually loaded onto gripping means 60, and base 62 is retracted so that the resistor is dipped into etching tank 50 for a predetermined amount of time. After expiration of time, base 62 is extended to lift the resistor out of tank 50 and arm 58 is extended to place the resistor over rinse tank 52. Base 62 is again retracted to dip the resistor into the rinse tank 52. This sequence of operations continue through the drying and measuring steps. If, after measuring, the value of the the resistor is not at the desired level, arm 58 may be retracted and the resistor may be cycled through the adjust process until its final value is reasonably approximated.

Control of arm 58 and base 62 may be achieved manually, or automatically by connection with control means 64. Control means 64 which may be a computer or the like, is connected to measuring apparatus 56, to sense the measured value of the etched resistor, and to base 62 and arm 58. If the sensed value is not close to a value preset into control means 64, the control means automatically recycles the resistor through the adjusting process. No explanation of the details of control means 64 is deemed necessary since it is well within the current knowledge of one having reasonable skill in the art of automatic controls.

After the coarse adjust process, the resistor is coated with a plating resist material, such as Nazdar 205, except for the area comprising the terminal lands. The terminal lands 16 are then electroplated with copper, gold or nickel gold, in order to be capable of forming a good solder joint with the connecting leads 18, to be described hereinafter. Any particular plating process maybe used which will effectively coat the terminal lands. After plating, the plating resist is removed from the resistor circuit pattern.

Figure 4A:
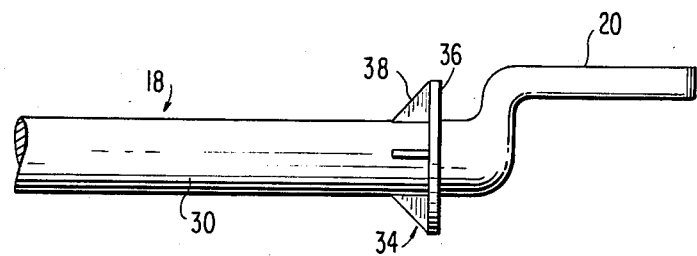
FIGS. 4A and 4B are side and top views, respectively, of the connecting leads according to the invention.
Figure 4B:
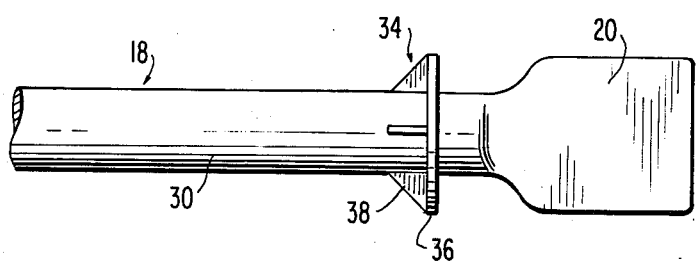

The terminal lands 16 are tinned and the connecting leads are soldered to each end of the circuit path, as shown in FIG. 1. A typical connecting lead 18 is shown in detail in FIGS. 4A and 4B. The lead comprises a generally cylindrical portion 30 and an offset, flattened portion 20. Offset flattened portion 20 is soldered to the terminal lands 16 as shown in FIG. 1. Optionally, talon head 34 is attached to the connecting lead 18 near the flattened portion 20 and comprises radially extending portion 36 and a plurality of longitudinal ribs 38. The talon heads 34 are surrounded by the molded coating (to be described hereinafter) applied to the completed resistor so as to prevent twisting of the leads about their axes with subsequent weakening of the soldered connections to the terminal lands 16. It is also within the scope of this invention to omit the talon heads 34 and use only the connecting leads as shown in FIG. 1.

After the connecting leads 18 are soldered to the terminal lands 16, the flux is cleaned from the solder joints. The resistor is then ready for fine adjustment to its final value. This is accomplished by cutting a slot 40 (shown in FIG. 1) in a portion of the circuit pattern. The cut alters the path of the current to adjust the resistance value of the circuit. It is envisioned that the cut may be made with extreme accuracy by a laser beam as known by those skilled in the resistor fabricating art.

Subsequent to the final adjustment, the resistor is subjected to an encapsulation treatment. The resistor is fully coated with varnish as previously described and then with rubber for strain relief. Both the varnish and rubber (which may be a silicone rubber such as Sylgard 182 or an RTV) may be applied by dipping the resistor and subsequently rotating it to assure an even coat.

Figure 5B:
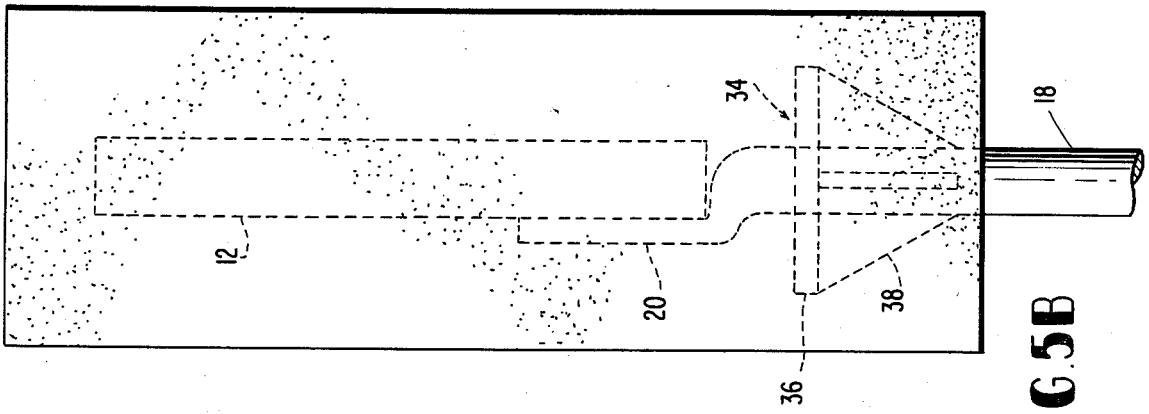
FIGS. 5A and 5B are top and side views, respectively, of a resistor made according to the invention.
Figure 5A:
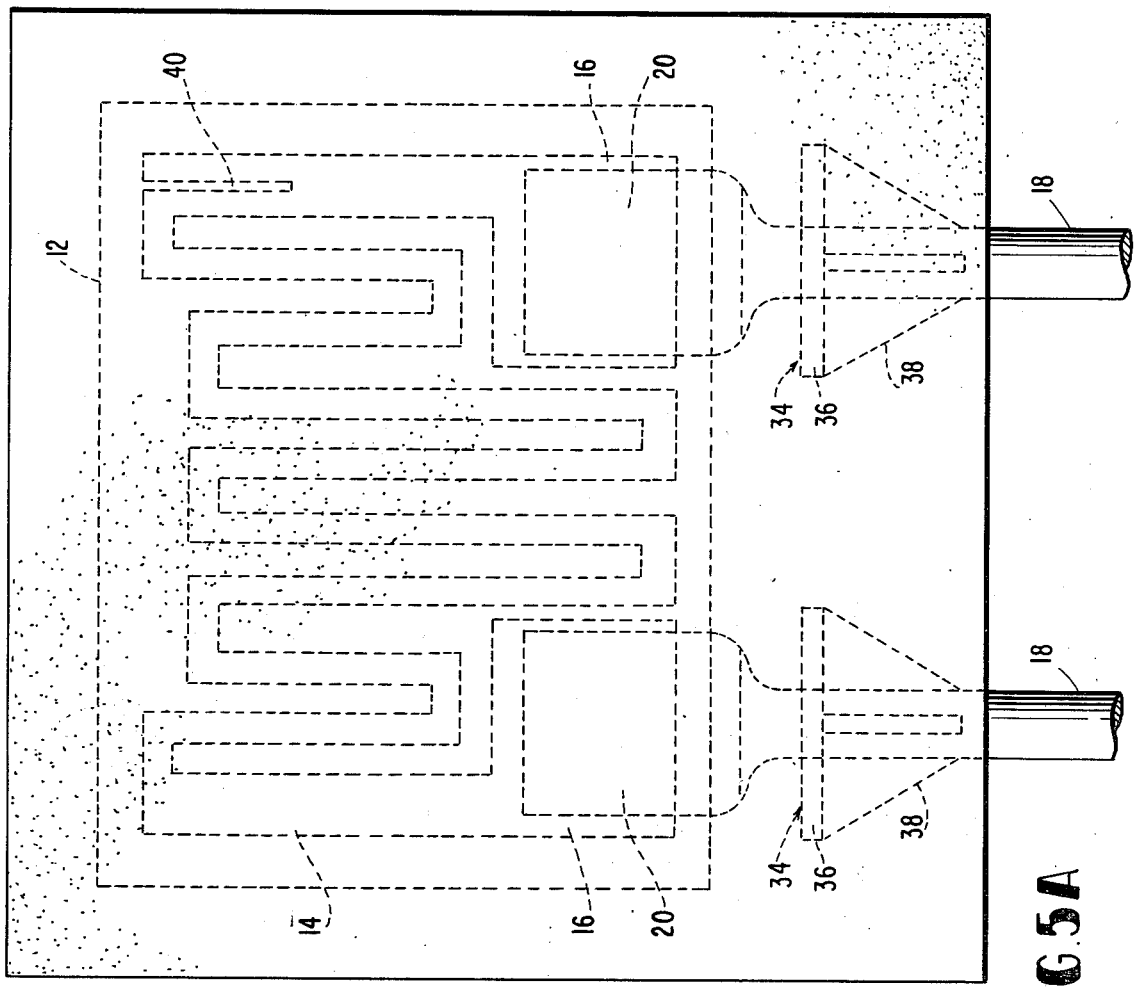

If a translucent varnish is used, it may be applied before the step of laser adjusting the resistor. By applying the varnish prior to the final adjustment, any possible change in resistance which may be caused by the coating is eliminated by the final adjustment. After coating with varnish and rubber, the resistor is placed in a mold and a hard, protective material is molded so as to completely surround the resistor such that only the connecting leads 18 extend from the completed molding. The molding is by the standard transfer molding process and need not be described in detail. The mold may be a two piece mold split laterally so that the resistor may be placed therein. The connecting leads, of course, extend through openings in the mold so as to not be completely covered. No special means are necessary to hold the resistor centrally in the mold, since the leads are sufficiently strong to achieve this purpose. The molded resistor is shown in FIGS. 5A and 5B with the substrate 12 foil circuit 14, and connecting leads 18 shown in dotted lines. Other methods of encapsulation, such as potting in a pre-formed case, known in the art, may also be used without exceeding the scope of this invention.

What is claimed is:

1. A method of making a metal foil electrical device comprising the steps of:
    (a) affixing a thin, conductive metal foil to an insulative substrate;
    (b) forming a masking material on said conductive metal foil in the shape of a desired electrical circuit having a plurality of terminals;
    (c) subjecting the device to a first acid etching treatment to remove all of the conductive metal foil except that covered by the masking material
    (d) removing the masking material from the conductive metal foil;
    (e) adjusting the value of the device by subjecting it to a second acid etching treatment which reduces the thickness of the conductive foil forming the electrical circuit;
    (f) attaching a connecting lead to each of the terminals and
    (g) encapsulating the electrical device such that the connecting leads protrude from said encapsulation.

2. The method of claim 1 wherein the connecting leads are attached to the terminals by soldering.

3. The method of claim 1 wherein encapsulating the electrical device comprises the steps of:
    (a) placing the electrical device in a mold;
    (b) molding a hard material around the electrical device such that said material completely surrounds said device; and
    (c) removing said encapsulated electrical device from said mold.

4. The method of claim 1 wherein said electrical device is a resistor.

5. The method of claim 1 wherein the thin conductive metal foil is bonded to the substrate.

6. The method of claim 5 wherein the conductive metal foil is bonded to the substrate by an epoxy adhesive.

7. The method of claim 1 wherein the affixing of the conductive metal foil to the substrate commprises the steps of:
    (a) placing a thin, even layer of adhesive on one surface of the substrate;
    (b) placing the thin conductive metal foil in contact with said adhesive layer;
    (c) placiing a sheet of Mylar in contact with said thin conductive metal foil;
    (d) placing a sheet of thin stainless steel in contact with said Mylar sheet;

(e) placing a sheet of rubber in contact with said thin stainless steel sheet;
(f) placing the structure laminated as in steps (a)–(e) into a vacuum press and closing said press so as not to exert any pressure on said laminate;
(g) drawing a vacuum in said press;
(h) closing the press fully to exert a positive pressure on said laminate; and
(i) curing said laminate such that the thin conductive metal foil is affixed to the substrate.

8. The method of claim 7 wherein the vacuum is drawn in the vacuum press for approximately 1 minute.

9. The method of claim 7 wherein the laminate is cured for approximately 20 minutes at approximately 335° F.

10. The method of claim 1 wherein adjusting the value of the electrical device by subjecting it to a second acid etching treatment comprises the steps of:
(a) spraying an etching solution onto the conductive metal foil to reduce the thickness thereof;
(b) rinsing the etching solution from the conductive foil; and
(c) drying the electrical device.

11. The method of claim 10 comprising the additional step of measuring the value of the electrical device after drying.

12. The method of claim 1 wherein forming the masking material comprises the steps of:
(a) photographing at least one of the desired circuit patterns and reducing it to the desired circuit pattern size;
(b) coating the surface of the thin, conductive metal foil with a photosensitive masking medium;
(c) photographically exposing and developing the desired circuit patterns onto the photosensitive masking medium; and
(d) etching away that portion of the thin conductive metal foil not corresponding to the desired circuit pattern.

13. The method of claim 12 wherein the first acid etching treatment is carried out by contacting the foil with a solution containing hydrochloric acid, nitric acid and water.

14. The method of claim 12 wherein the first acid etching treatment is carried out by contacting the metal foil with a solution containing hydrochloric acid and stannous chloride.

15. The method of claim 1 including the further step of electroplating said terminals.

16. The method of claim 15 wherein electroplating said terminals comprises the steps of:
(a) coating the formed electrical circuit with a screened or masking medium, except for the terminal areas;
(b) electroplating said terminals with a metal selected from the group consisting of nickel, copper, and gold; and
removing the masking medium from the electrical circuit.

17. The method of claim 1 further comprising the step of further adjusting the electrical device to its final value by cutting through a portion of the electrical circuit pattern to alter the current path prior to encapsulating said device.

18. The method of claim 17 wherein the cutting is achieved by directing a laser beam onto the circuit.

19. In a method of making an electrical device having a thin film of conductive foil formed in an electrical circuit pattern affixed to an insulative substrate the improvement comprising adjusting the electrical device to its approximate final value by subjecting it to an acid etching treatment thereby reducing the thickness of the foil.

* * * * *